(12) United States Patent
Ranade et al.

(10) Patent No.: US 7,598,142 B2
(45) Date of Patent: Oct. 6, 2009

(54) CMOS DEVICE WITH DUAL-EPI CHANNELS AND SELF-ALIGNED CONTACTS

(76) Inventors: Pushkar Ranade, 3057 NW. Overlook Dr., #1435, Hillsboro, OR (US) 97124; Keith E. Zawadzki, 2326 NE. 11th, Portland, OR (US) 97212

(*) Notice: Subject to any disclaimer, the term of this patent is extended or adjusted under 35 U.S.C. 154(b) by 89 days.

(21) Appl. No.: 11/724,362

(22) Filed: Mar. 15, 2007

(65) Prior Publication Data
US 2008/0227250 A1    Sep. 18, 2008

(51) Int. Cl.
*H01L 21/336*    (2006.01)
(52) U.S. Cl. .............. 438/269; 438/199; 438/218; 438/221; 438/222; 438/226; 257/351; 257/E21.626; 257/E21.64
(58) Field of Classification Search .............. 438/154, 438/164, 172, 191, 218, 221, 222, 226, 269; 257/351
See application file for complete search history.

(56) References Cited

U.S. PATENT DOCUMENTS

| | | | |
|---|---|---|---|
| 5,949,105 A * | 9/1999 | Moslehi ................ | 257/336 |
| 6,204,100 B1 * | 3/2001 | Kim ...................... | 438/154 |
| 6,512,282 B2 | 1/2003 | Esaki | |
| 6,777,761 B2 * | 8/2004 | Clevenger et al. ....... | 257/388 |
| 6,991,972 B2 | 1/2006 | Lotchtefeld et al. | |
| 2005/0104131 A1 * | 5/2005 | Chidambarrao et al. .. | 257/369 |
| 2006/0046448 A1 * | 3/2006 | Barns et al. ............ | 438/585 |

FOREIGN PATENT DOCUMENTS

WO PCT/US2008/056939    3/2008

OTHER PUBLICATIONS

Ranade, Pushkar, "Active Regions With Compatible Dielectric Layers", filed: Sep. 18, 2006, U.S. Appl. No. 11/523,105.
Ranade, Pushkar, "Method of Forming CMOS Transistors With Dual-Metal Silicide Formed Through the Contact Openings and Structures Formed Thereby", filed: Mar. 29, 2007, U.S. Appl. No. 11/693,608.

* cited by examiner

*Primary Examiner*—Charles D. Garber
*Assistant Examiner*—Yasser A Abdelaziez
(74) *Attorney, Agent, or Firm*—Rahul D. Engineer

(57) ABSTRACT

A CMOS device having dual-epi channels comprises a first epitaxial region formed on a substrate, a PMOS device formed on the first epitaxial region, a second epitaxial region formed on the substrate, wherein the second epitaxial region is formed from a different material than the first epitaxial region, an NMOS device formed on the second epitaxial region, and electrical contacts coupled to the PMOS and NMOS devices, wherein the electrical contacts are self-aligned.

7 Claims, 6 Drawing Sheets

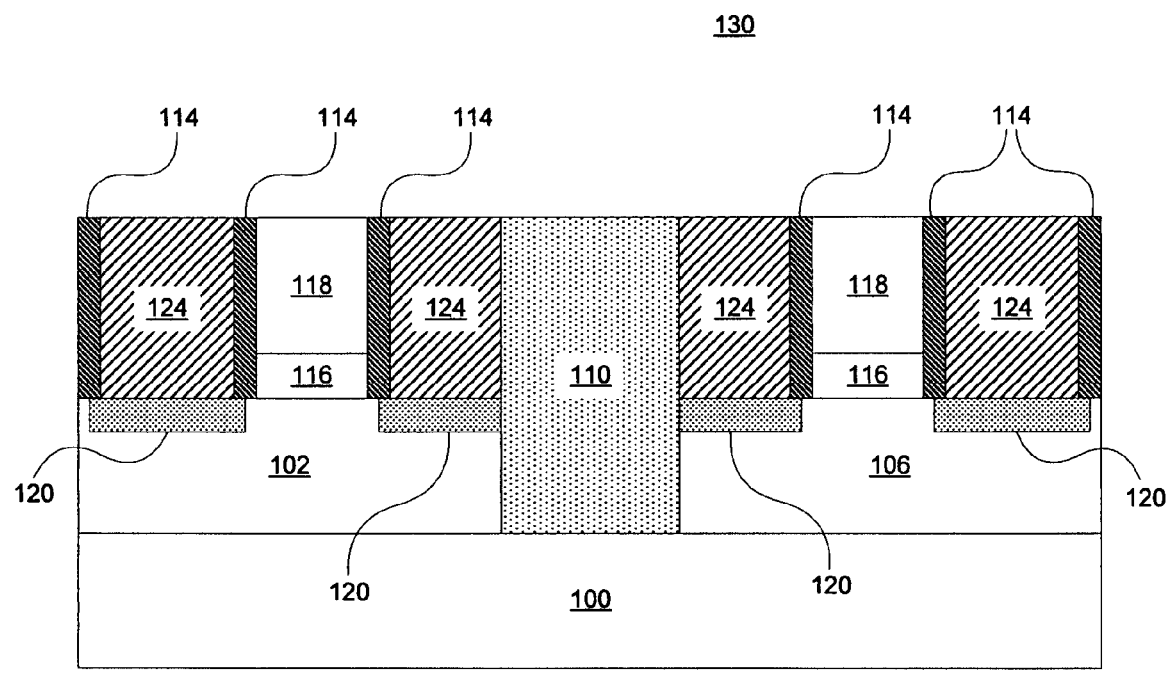
FIG._1

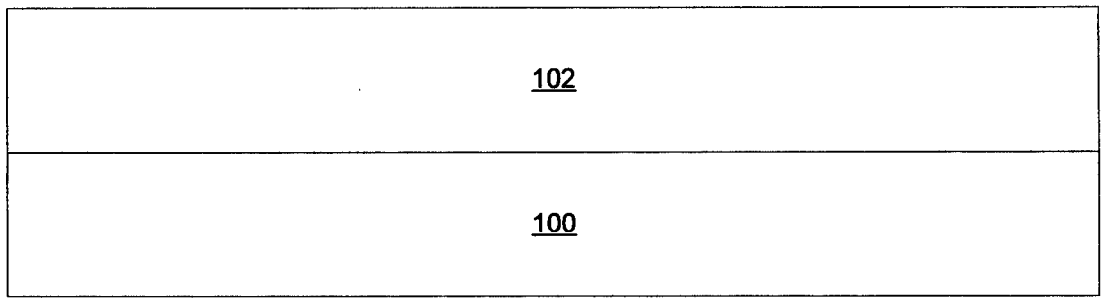
FIG._2
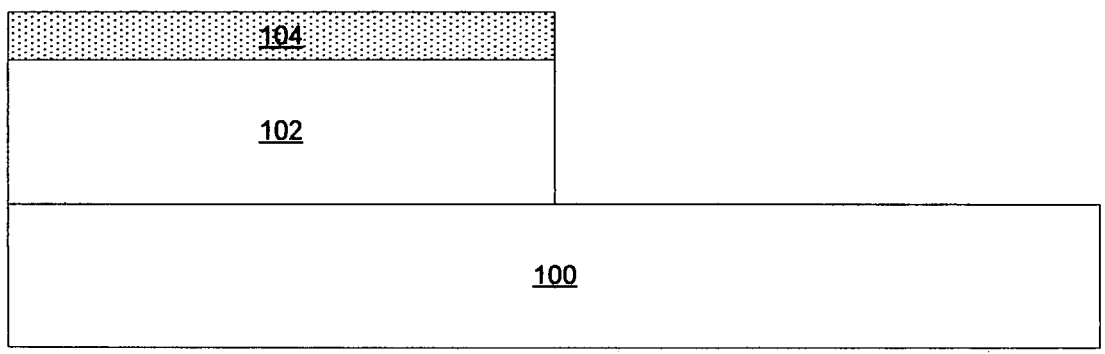
FIG._3
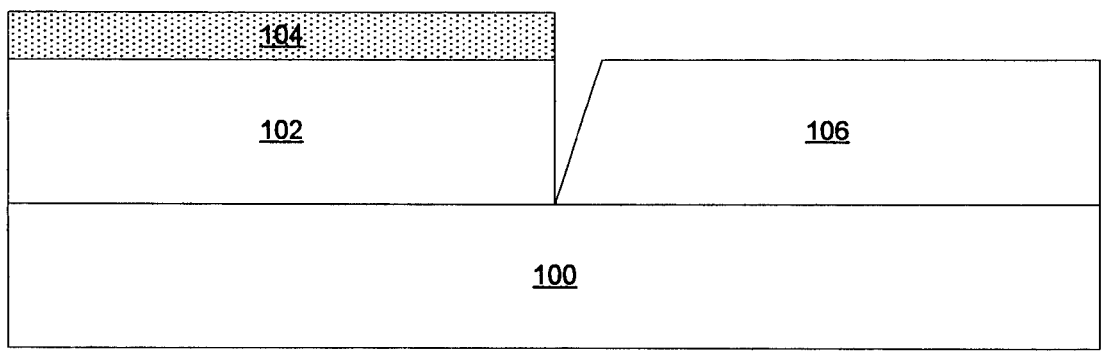
FIG._4

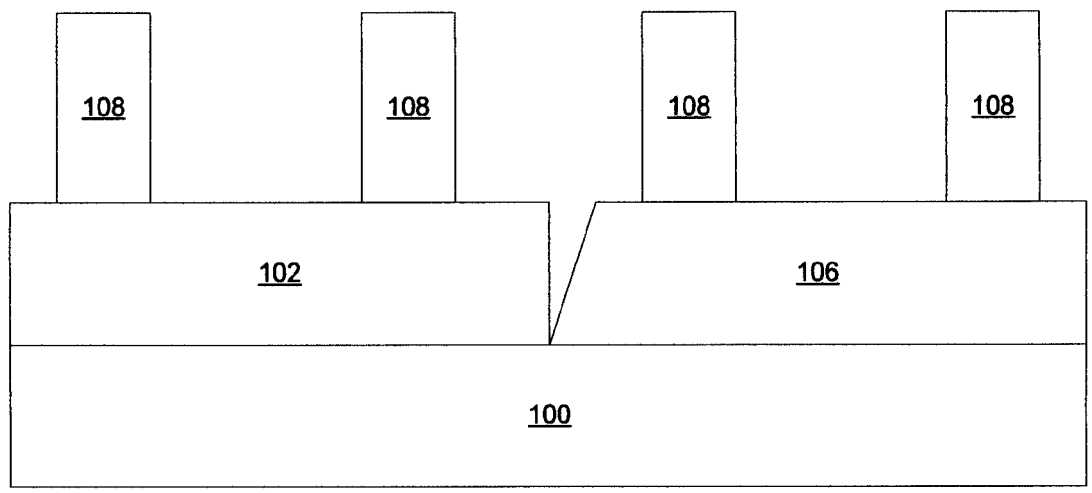
FIG._5
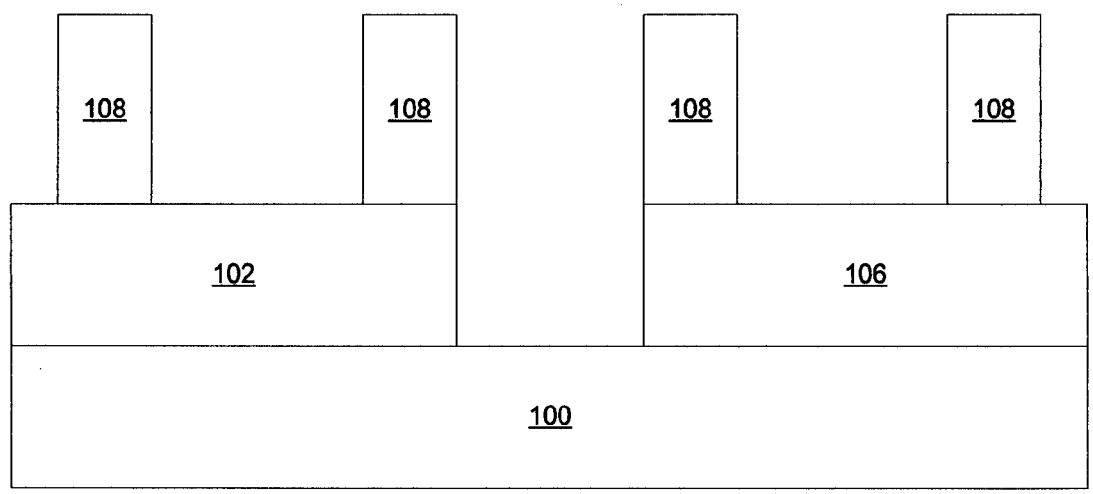
FIG._6

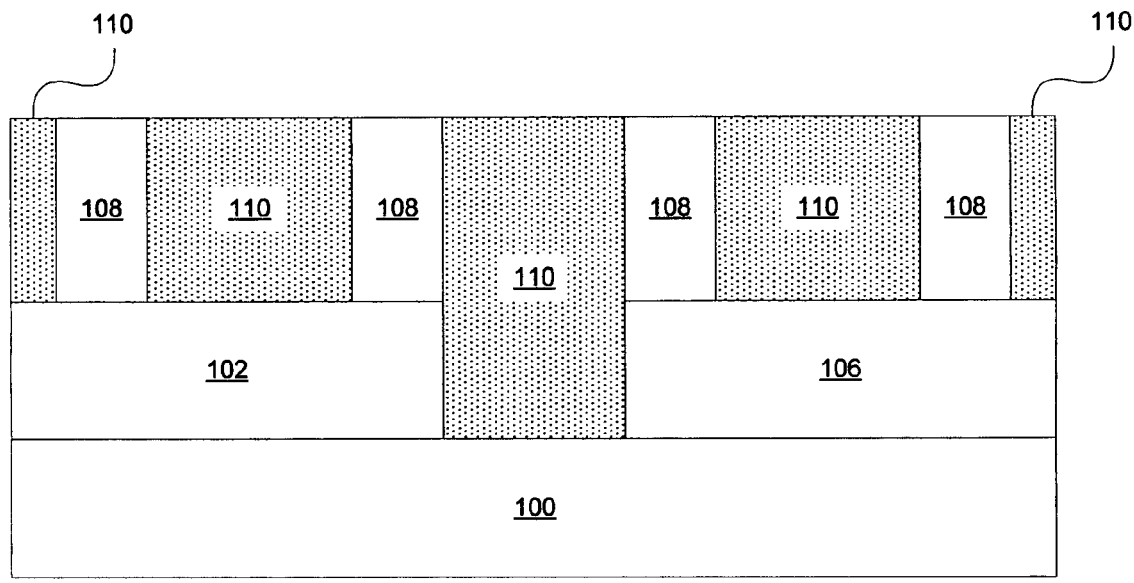
*FIG._7*
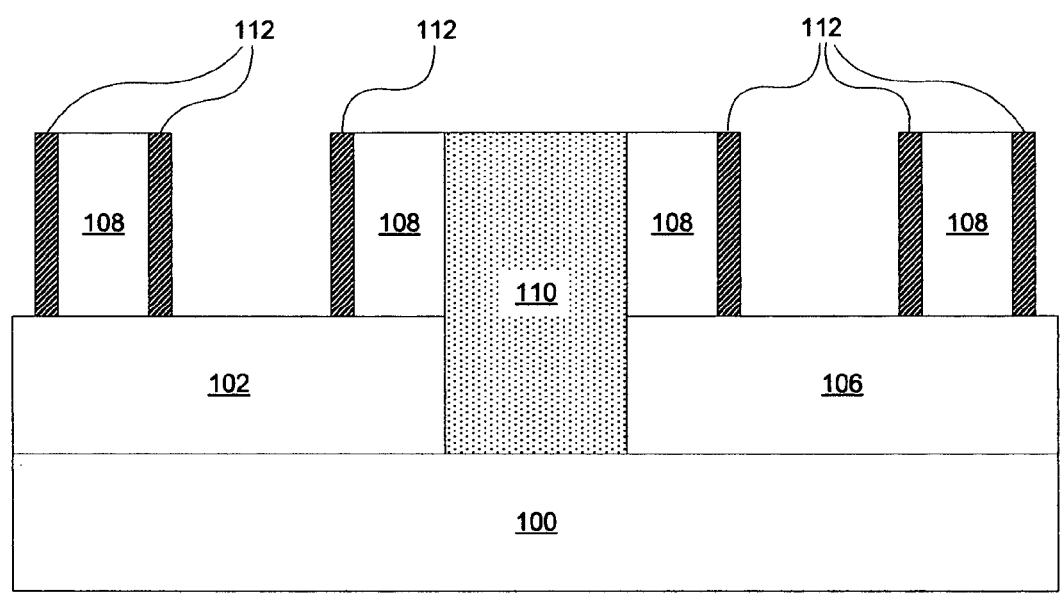
*FIG._8*

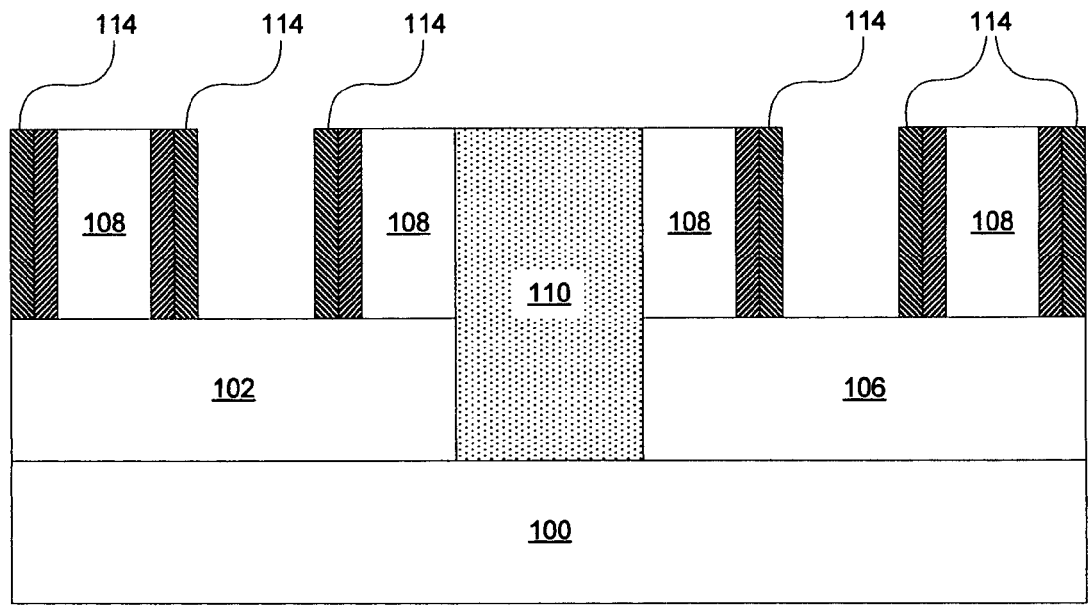
FIG._9
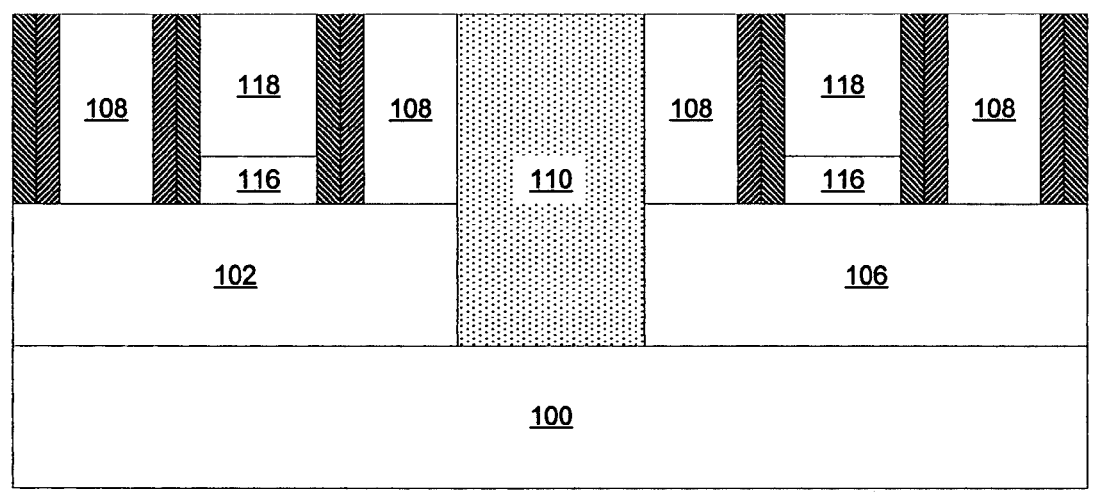
FIG._10

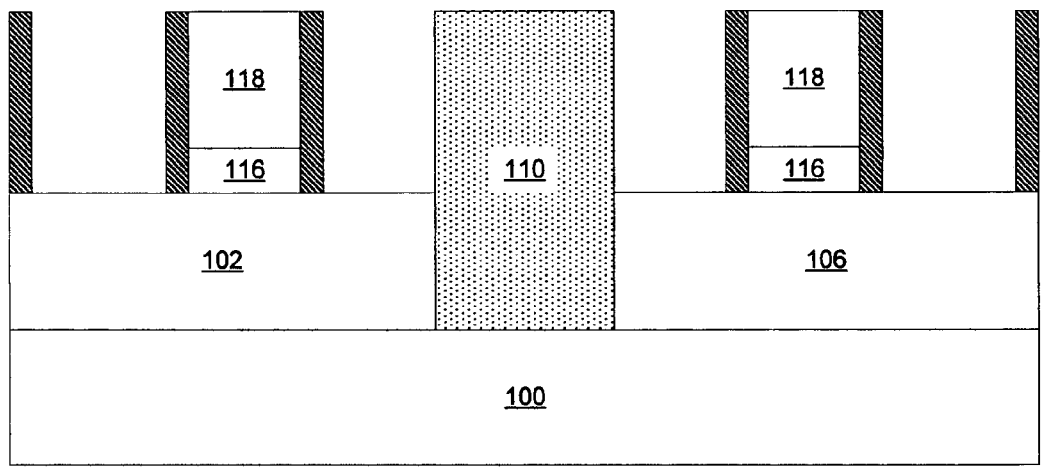
FIG._11
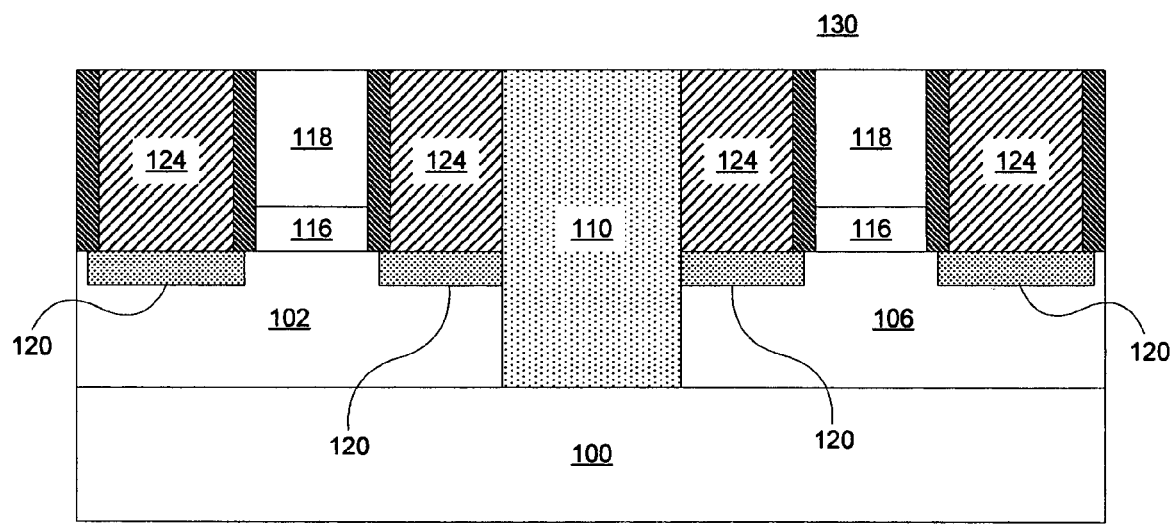
FIG._12

CMOS DEVICE WITH DUAL-EPI CHANNELS AND SELF-ALIGNED CONTACTS

BACKGROUND

Complementary metal-oxide-semiconductor (CMOS) technology is heavily used in the manufacture of integrated circuits. A typical CMOS device includes two types of transistors, a P-type metal-oxide-semiconductor field effect transistor (MOSFET) and an N-type MOSFET. Current fabrication processes for CMOS devices use a single type of epitaxial material upon which the P-type and N-type MOSFETs are built. This means that current CMOS devices cannot optimize the materials used in each of the P-type and N-type MOSFETs.

In addition, as CMOS devices are scaled down, process complexities cause additional problems. For instance, patterning electrical contacts to the source and drain regions of each of the MOSFETs is a very difficult lithography operation due to the tight registration requirements in a small opening.

As such, a simplified process flow is needed to enable the optimization of materials used in the P-type and N-type MOSFETs and to improve the formation of electrical contacts to the CMOS device.

BRIEF DESCRIPTION OF THE DRAWINGS

FIG. 1 is a CMOS device with dual-epitaxial regions fabricated in accordance with an implementation of the invention.

FIGS. 2 through 12 illustrate a fabrication process flow for the CMOS device shown in FIG. 1.

DETAILED DESCRIPTION

Described herein are systems and methods of forming CMOS devices that include a dual-epi channel and self-aligned contacts. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

FIG. 1 illustrates a CMOS device 130 formed in accordance with implementations of the invention. The CMOS device 130 is formed upon a semiconductor substrate 100. The semiconductor substrate 100 may be formed using a bulk silicon or a silicon-on-insulator substructure. In other implementations, the substrate may be formed using alternate materials, which may or may not be combined with silicon, that include but are not limited to germanium, indium antimonide, lead telluride, indium arsenide, indium phosphide, gallium arsenide, gallium antimonide, or other Group II-V materials. Although a few examples of materials from which the semiconductor substrate may be formed are described here, any material that may serve as a foundation upon which a semiconductor device may be built falls within the spirit and scope of the present invention.

Two epitaxial silicon regions are deposited or grown on the substrate 100. One epitaxial region 102 (also referred to herein as an epi region 102) may be optimized for a P-type MOSFET (PMOS transistor), while a second epitaxial region 106 (also referred to herein as an epi region 106) may be optimized for an N-type MOSFET (NMOS transistor). As such, the epi region 102 may be formed from a different material than the epi region 106, and therefore, the CMOS device shown in FIG. 1 provides dual-epi channel regions.

The epi region 102 may be formed from materials such as silicon germanium. The silicon germanium may be epitaxially deposited. In some implementations, the germanium concentration may range from 10 atomic % to 50 atomic %. In further implementations, the silicon germanium may be further doped in situ with boron. The boron concentration may range from $2 \times 10^{19}/cm^3$ to $7 \times 10^{20}/cm^3$. The thickness of the silicon germanium may range from 50 Å to 1500 Å.

The epi region 106 may be formed from materials such as carbon doped silicon. The carbon doped silicon may be epitaxially and selectively deposited. In further implementations, the carbon doped silicon may be further doped in situ with phosphorous. The carbon concentration may range from 0.5 atomic % to 3.0 atomic %. The phosphorous concentration may range from $5 \times 10^{19}/cm^3$ to $5 \times 10^{20}/cm^3$. The thickness of the carbon doped silicon may range from 50 Å to 1500 Å. The carbon and phosphorous doped silicon may be denoted as $(C,P)_y Si_{(1-y)}$.

The CMOS device 130 includes an isolation structure 110 that separates the PMOS transistor from the NMOS transistor. The isolation structure 110 may be formed from materials conventionally used in isolation structures, including but not limited to oxide materials such as silicon dioxide ($SiO_2$).

Each of the PMOS and NMOS transistors includes a high-k gate dielectric layer 116. In various implementations of the invention, the high-k dielectric material that is used in each gate electrode may include, but is not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, the high-k gate dielectric layer may be between around 5 Angstroms (Å) to around 50 Å thick. In further embodiments, additional processing may be performed on the high-k gate dielectric layer, such as an annealing process to improve the quality of the high-k material.

In some implementations of the invention, different high-k gate dielectric materials may be used for each epi region. In other implementations, the same high-k gate dielectric materials may be used for each epi region. In some implementations, if the same high-k gate dielectric material is used in each epi region, their thicknesses may be optimized individually. For instance, if gate leakage is lower in the PMOS device due to high-k bandgap, the PMOS device may be optimized by using a thinner high-k gate dielectric layer.

A metal gate electrode 118 is formed on each of the two high-k gate dielectric layers 116. The metal gate electrode 118 may consist of a P-type workfunction metal or an N-type workfunction metal, depending on whether the transistor is to be a PMOS or an NMOS transistor. For the PMOS transistor being formed on epi region 102, materials that may be used to form a P-type workfunction metal layer include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV.

Alternately, for the NMOS transistor being formed on epi region 106, materials that may be used to form an N-type workfunction metal layer include, but are not limited to, hafnium, zirconium, titanium, tantalum, aluminum, and their alloys, e.g., metal carbides that include these elements, i.e., hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, two or more metal gate electrode layers may be deposited. For instance, a workfunction metal may be deposited followed by a metal gate electrode fill metal such as aluminum metal.

Each of the PMOS and NMOS transistors include source and drain regions 120. In some implementations, the source and drain regions 120 may be formed by either implanting dopants such as boron, phosphorous, or arsenic into the substrate or by etching the substrate and then epitaxially depositing a silicon or silicon germanium material. Electrical contacts 124 are formed atop the source and drain regions 120. The contacts 124 are generally formed of a metal such as copper, aluminum, or tungsten. In accordance with implementations of the invention, the contacts 124 are self-aligned. In some implementations, a salicidation process may occur prior to formation of the self-aligned contacts 124.

Finally, the CMOS device 130 may include a plurality of spacers 114. The spacers 114 are formed during fabrication of the CMOS device 130 and enable at least some of the self-alignment of the various structures. The spacers 14 may be formed from material well known in the art for use in spacers, including but not limited to silicon nitride (SiN), silicon oxide (SO), silicon carbide (SiC), silicon nitride doped with carbon (SiNC), and silicon oxynitride (SiON).

FIGS. 2 through 12 illustrate a fabrication process to build the CMOS device 130 shown in FIG. 1. Starting with FIG. 2, a substrate 100 is shown upon with an epi layer 102 is grown or deposited. Materials used for the substrate 100 and the epi layer 102 are provided above.

Moving to FIG. 3, the epi layer 102 is patterned to form an epi region 102. The patterning process used may be any conventional patterning process known in the art. For instance, a photoresist material may be deposited and patterned using ultraviolet radiation and an optical mask to form a photoresist mask 104. The mask 104 may shield the portion of the epi layer 102 that will remain on the substrate 100 and may expose the portion that needs to be removed. A wet or dry etching process appropriate for the epi material may then be carried out to etch away the exposed portions of the epi layer 102, leaving behind the shielded epi region 102 shown in FIG. 3.

Turning to FIG. 4, a second epitaxial deposition process may be carried out to form an epi region 106. The epi region 106 is grown or deposited on the substrate 100 adjacent to the epi region 102. Because of structural differences between the epi region 102 and the epi region 106, such as lattice spacing, and possibly because of the nature of the epitaxial deposition process, the interface between the two epi regions 102/106 may be less than ideal.

Turning to FIG. 5, the photoresist mask 104 may be removed using, for instance, a planarization process or an etching process as is well known in the art. Next, a plurality of sacrificial structures 108 may be formed on the epi regions 102 and 106. The sacrificial structures 108 may be formed from a material such as polysilicon. In some implementations, a layer of polysilicon may be deposited and patterned using known patterning methods to form the sacrificial structures 108. As shown in FIG. 5, two sacrificial structures 108 are formed over the epi region 102 and two sacrificial structures 108 are formed over the epi region 106. In some implementations, the sacrificial structures 108 are formed at locations on the epi regions 102/106 where the self-aligned contacts 124 will later be formed.

Turning to FIG. 6, an etching process is carried out to remove portions of each epi region 102 and 106 adjacent to the interface between the two epi regions. Two of the sacrificial structures 108 may be used as boundaries for the etch. As shown in FIG. 6, a portion of the epi region 102 that was adjacent to the epi region 106 is etched back until a sacrificial structure 108 is reached. Similarly, a portion of the epi region 106 that was adjacent to the epi region 102 is etched back until a sacrificial structure 108 is reached.

Turning to FIG. 7, an oxide 110 is deposited over the substrate 100. The oxide 110 fills in the region between the epi region 102 and the epi region 106, thereby forming an isolation structure. The top of the oxide isolation structure 110 substantially coincides with the tops of the sacrificial structures 108. In implementations of the invention, the initial oxide deposition may be followed by a polishing process that planarizes the top of the oxide layer to coincide with the tops of the sacrificial structures 108.

Turning to FIG. 8, the oxide 110 is patterned to remove all of the oxide except for the portion deposited between the epi region 102 and the epi region 106. This remaining portion of the oxide functions as an isolation structure 110. Conventional patterning processes may be used to remove the unnecessary oxide. Next, a first set of spacers 112 are formed adjacent to the sacrificial structures 108. The spacers 112 may be formed by depositing a conformal spacer material and then patterning the material to form the spacers 112 shown in FIG. 8. The material used to form the first set of spacers 112 may be chosen from SiN, SO, SiC, SiNC, and SiON, among others.

Turning to FIG. 9, a second set of spacers 114 are formed adjacent to the first set of spacers 112. This second set of spacers 114 may be formed using a similar process as the first set of spacers, namely deposition and patterning. In accordance with implementations of the invention, the material used to form the second set of spacers 114 must be different than the material used to form the first set of spacers 112. This is because the material used in the second set of spacers 114 must have a different etch sensitivity than the material used in the first set of spacers 112, thereby enabling the first set of spacers 112 to be removed without substantially impacting the second set of spacers 114. The material used for the second set of spacers 114 may still be chosen from SiN, SO, SiC, SiNC, and SiON, among others—it must simply be different than the material selected for the first set of spacers 112. For instance, if the first set of spacers 112 are formed using SiN, then the second set of spacers 114 may be formed using one of SO, SiC, SiNC, or SiON. In some implementations of the invention, the etch rate sensitivity of the first set of spacers 112 and the second set of spacers 114 may be made different by altering their carbon concentrations.

Turning now to FIG. 10, the trenches that remain between the spacers 114 are filled with a high-k gate dielectric layer 116 and a metal gate electrode 118. As will be appreciated by those of skill in the art, the high-k gate dielectric 116 and metal gate electrode 118 that are formed over the epi region 102 may differ from the high-k gate dielectric 116 and metal gate electrode 118 that are formed over the epi region 106. For instance, if the epi region 102 is optimized for a PMOS transistor, then the high-k gate dielectric layer 116 and metal gate electrode 119 formed over the epi region 102 use materials appropriate for a PMOS transistor. Such materials were described above. Similarly, if the epi region 106 is optimized for an NMOS transistor, then the high-k gate dielectric layer 116 and metal gate electrode 119 formed over the epi region 106 use materials appropriate for an NMOS transistor. Again, such materials were described above. In some implementations, one of the epi regions 102/106 may be masked while the high-k gate dielectric and the gate electrode are deposited onto the other of the epi regions 102/106.

In accordance with implementations of the invention, using the above described spacer deposition and etch process to form trenches in which the high-k gate and the metal gate electrode may be deposited is an improvement over conventional processes. For instance, conventional processes that deposit a high-k layer and a gate electrode layer and then etch these layers back to form the gate stack tend to be complex since these materials are difficult to etch, which results in significant gate damage during the etching process.

Turning now to FIG. 11, the sacrificial structures 108 and the first set of spacers 112 are removed. Conventional etching processes appropriate for polysilicon may be used. The spacers 112 may be removed using an etchant that is appropriate for the material used in the spacers 112 but that will not remove the material used to form the second set of spacers 114. The removal of the sacrificial structures 108 and the spacers 112 creates several trenches that expose portions of the epi regions 102 and 106.

An ion implantation process may then be carried out to implant ions into the exposed portions of the epi regions 102 and 106. The implanted ions form source and drain regions 120, shown in FIG. 12. An annealing process may follow the ion implant to diffuse and/or activate the dopants. In some implementations, the dopant may be boron.

FIG. 12 illustrates the source and drain regions 120, as well as electrical contacts 124 that are deposited into the trenches over the source and drain regions 120. Metals that may be used in the contacts 124 were described above. The contacts 124 are formed in a self-aligned manner because they are formed by depositing material into the trenches left behind by the sacrificial structures 108 and the spacers 112. The final result is a CMOS device 130.

Accordingly, a fabrication process flow for a dual-epitaxial channel CMOS device has been described. In accordance with implementations of the invention, the use of dual-epitaxial regions to form the PMOS and NMOS devices allows the high-k gate dielectric and the metal gate electrode to be separately optimized. Furthermore, the process flow for the dual-epi CMOS device of the invention uses self-aligned features to enable a scaling down of the CMOS device while avoiding conventional issues such as offset landings of contacts. In conventional processes, contact patterning to the source and drain regions tends to be a very difficult lithography operation due to the tight registration requirements in a small opening. Self-alignment to the gate is a preferred option for a robust contact-to-gate distance as well as contact dimension. The contact dimensions and contact-to-gate distance are critical features for MOS performance because it directly impacts the external resistance of the MOS device.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
epitaxially depositing a silicon germanium epi region on a substrate;
epitaxially depositing a carbon doped silicon epi region on the substrate;
forming an isolation structure on the substrate between the silicon germanium epi region and the carbon doped silicon epi region;
forming a first set of spacers on the silicon germanium epi region;
forming a second set of spacers on the carbon doped silicon epi region;
forming a first high-k gate dielectric layer in a trench between the first set of spacers on the silicon germanium epi region;
depositing a first metal gate electrode atop the first high-k gate dielectric layer;
depositing a second high-k gate dielectric layer in a trench between the second set of spacers on the carbon doped silicon epi region;
depositing a second metal gate electrode atop the second high-k gate dielectric layer;
implanting ions within the silicon germanium epi region to form a first source region and a first drain region;
implanting ions within the carbon doped silicon epi region to form a second source region and a second drain region;
and
forming electrical contacts to the first and second source regions and to the first and second drain regions.

2. The method of claim 1, wherein the forming of the isolation structure comprises removing a portion of each of the first and second epi regions at their interface and depositing an oxide layer.

3. The method of claim 1, wherein the forming of the first set of spacers comprises depositing a conformal layer of a first spacer material ever the substrate and patterning the first spacer material to form the first set of spacers.

4. The method of claim 3, wherein the forming of the second set of spacers comprises depositing a conformal layer of a second spacer material over the substrate and patterning the second spacer material to form the second set of spacers, wherein the second spacer material has a different etch sensitivity than the first spacer material.

5. The method of claim 1, wherein:
the depositing of the first high-k gate dielectric layer comprises depositing a material selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, and the depositing of the first metal gate electrode comprises depositing a metal selected from the group consisting of ruthenium, palladium, platinum, cobalt, nickel, and ruthenium oxide.

6. The method of claim 1, wherein:

the depositing of the second high-k gate dielectric layer comprises depositing a material selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, and the depositing of the second metal gate electrode comprises depositing a metal selected from the group consisting of hafnium, zirconium, titanium, tantalum, aluminum, hafnium carbide, zirconium carbide, titanium carbide, tantalum carbide, and aluminum carbide.

7. The method of claim 1, wherein the forming of the electrical contacts comprises depositing on the substrate a metal selected from the group consisting of copper. aluminum, and tungsten.

* * * * *